United States Patent [19]

Tanabe et al.

[11] Patent Number: 4,824,397

[45] Date of Patent: Apr. 25, 1989

[54] ELECTRICAL CONNECTING DEVICE

[75] Inventors: Tunehiko Tanabe; Fumiyoshi Kawada, both of Nara, Japan

[73] Assignee: Sharp Kabushiki Kaisha, Osaka, Japan

[21] Appl. No.: 188,102

[22] Filed: Apr. 27, 1988

Related U.S. Application Data

[63] Continuation of Ser. No. 51,167, May 18, 1987, abandoned, which is a continuation of Ser. No. 822,968, Jan. 28, 1986, abandoned, which is a continuation of Ser. No. 676,226, Nov. 30, 1984, abandoned, which is a continuation of Ser. No. 468,960, Feb. 23, 1983, abandoned.

[30] Foreign Application Priority Data

Feb. 25, 1982 [JP] Japan .................................. 57-30213
Feb. 25, 1982 [JP] Japan .................................. 57-30214

[51] Int. Cl.⁴ .............................................. H01R 13/04
[52] U.S. Cl. ...................................................... 439/496
[58] Field of Search .......... 339/17 F, 176 MF, 143 R; 174/35 C, 117 F, 117 FF, 102 R; 439/492-499, 607-610

[56] References Cited

U.S. PATENT DOCUMENTS

| | | | |
|---|---|---|---|
| 3,069,753 | 12/1962 | Lalmond et al. | 339/176 MF |
| 3,084,302 | 4/1963 | Braeutigam | 339/17 F |
| 3,582,532 | 6/1971 | Plummer | 174/102 R |
| 3,748,628 | 7/1973 | Reimer | 339/176 MF |
| 3,923,364 | 12/1975 | Shapiro et al. | 339/176 MF |
| 4,188,086 | 2/1980 | Inouye | 339/176 MF |
| 4,420,201 | 12/1983 | Stephenson | 339/14 R |
| 4,422,700 | 12/1983 | Krenz | 339/14 R |

FOREIGN PATENT DOCUMENTS

| | | | |
|---|---|---|---|
| 1808453 | 1/1971 | Fed. Rep. of Germany | 339/17 F |
| 2645387 | 5/1977 | Fed. Rep. of Germany | 339/176 MF |
| 1392278 | 4/1975 | United Kingdom | 339/176 MF |

Primary Examiner—Joseph H. McGlynn
Attorney, Agent, or Firm—Birch, Stewart, Kolasch & Birch

[57] ABSTRACT

The present invention relates to an electrical connecting device in which the cable is made from a flexible wiring substrate, bent into a U-shaped configuration at a prescribed location, and inserted into the space between the connector terminals. Because of this construction each spacing of terminals contained in each of the respective rows of terminal groups becomes very narrow, and the cable and connector can be reliably joined an electrically connected at the terminal.

10 Claims, 4 Drawing Sheets

ELECTRICAL CONNECTING DEVICE

This application is a Continuation of application Ser. No. 051,167, filed May 18, 1987, Ser. No. 822,968, filed Jan. 28, 1986, Ser. No. 676,226, filed Nov. 30, 1984 and Ser. No. 468,960, filed Feb. 23, 1983, all of which are now abandoned.

BACKGROUND OF THE INVENTION

The present invention relates to an electrical connecting device which is used to connect apparatuses or substrates with a cable and, more particularly, the present invention relates to the protection of a cable for connecting apparatuses or substrates.

Conventionally, an electrical connecting device is used to join a flat conductive wiring, arranged in rows, to a group of connector terminals, using solder or welding. However, with this type of electrical connecting device, it is difficult to make the terminal pitch spacing narrower, to any degree. Therefore, if the number of signal lines becomes great, the problem arises that the connector width expands because of the large number of signal lines and, if the width of the cable increases, the flexibility of the whole body of the cable decreases.

Conventionally, a cable comprises a plurality of parallel wirings covered with synthetic resin or similar coating. However, because the so constructed cable is not shielded, the cable may be subject to effects from static electricity, external electrical noise, and undesirable radiation.

Accordingly, the abovementioned cable is wrapped in a metal casing and, in addition, the use of a cable coated with a synthetic resin is adopted. However, this type of shielded cable, being of multi-layered construction, becomes thick and large, and has the additional problem of lacking flexibility.

In the future, as equipment is made more compact through large scale integration circuitry, and is further intended to handle large numbers of signals, the abovementioned problems become very important.

OBJECT AND SUMMARY OF THE INVENTION

The present invention is made with due consideration of the abovementioned problems, and has as its object the elimination of the above problems, and relates to an electric connecting device in which the cable is made from a flexible wire substrate, bent into a U-shape at a prescribed section, and inserted into the space between the connector terminals, and because of this construction each spacing of terminals contained in each of the respective rows of terminal groups becomes very narrow, and the cable and connector can be reliably joined at the terminal.

In addition, the present invention provides as its object a cable in which a highly flexible wire member made of metal wire or carbon fiber in the form of a net or cloth is used as a connecting member, and by use of a wrapped-up construction it is effectively sealed.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

One embodiment of the present invention is concerned with an electric connecting device comprising a flexible wiring substrate and a connector. A plurality of electric wirings are printed on the substrate. The connector has a group of terminals. A prescribed section of this flexible wire substrate is bent into a U-shaped form, and is inserted into the space between the terminals of the connector.

Another embodiment of the present invention concerned with an electric connecting device comprising the flexible wiring substrate, the connector and a shield means. The shield means is provided for shielding the flexible wiring substrate.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIG. 5 (2) is schematic drawing showing another embodiment of the electric connecting device according to the present invention being used between equipments or substrates;

FIG. 6 (2) is a side view of the electric connecting device with the flexible wiring substrate of FIG. 6 (1) bent and inserted into a connector having three rows of terminals;

FIG. 9 (2) is a sectional drawing of the electric connecting device through section 9(2)—9(2) of FIG. 8;

FIG. 10 (2) is an perspective view of the cable of FIG. 10 (1) after the protective cable cover has been pressed;

DETAILED DESCRIPTION OF THE INVENTION

The following is a detailed description of one embodiment of the present invention with reference to the drawings.

Figure 1:
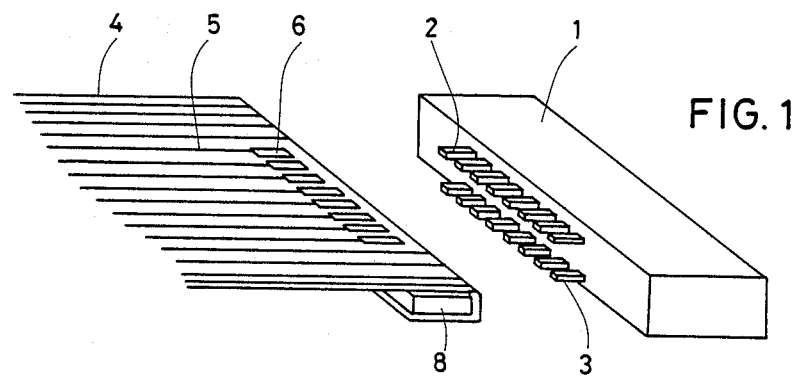
FIG. 1 is a schematic drawing of one embodiment of the electric connecting device according to the present invention.

FIG. 1 is a schematic drawing of one embodiment of an electric connecting device according to the present invention.

The electric connecting device comprises a flexible wiring substrate 4 and a connector 1. Connector terminals 2 and 3 of the connector 1 are not electrodes for making connections to another apparatus or another substrate, but are electrodes for making connections to a cable. Here, the flexible wiring substrate 4 is also acting as a cable.

Electric wirings 5 of the flexible wiring substrate 4 are formed with copper foil etching or carbon paste printing on a resin film such as polyester film or polyamide film. Electrodes 6 are connected to the terminals 2 of the connector 1.

A die plate 8 is a resin bar, and the flexible wiring substrate 4 is bent around the die plate 8. In order that the flexible wiring substrate 4 is fixed with being bent, a tape is provided on both the top and the bottom surfaces of the die plate 8.

Figure 2:
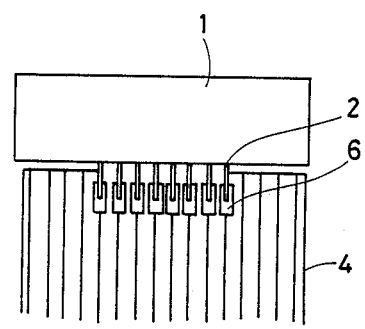
FIG. 2 shows a bent flexible wiring substrate of the electric connecting device of FIG. 1, inserted into the space between terminals of a connector.

FIG. 2 shows the bent flexible wiring substrate 4 of the electric connecting device of FIG. 1 inserted into the space between the terminals 2 and 3 of the connector 1, in one embodiment of the present invention. Here, the electrodes 6 and the terminals 2 are connected at an identical pitch. If the electrodes 6 is made of copper, this connection will be soldered. When the positions of the electrodes 6 and the terminals 2 match, the soldering is carried out very easily.

Figure 3:
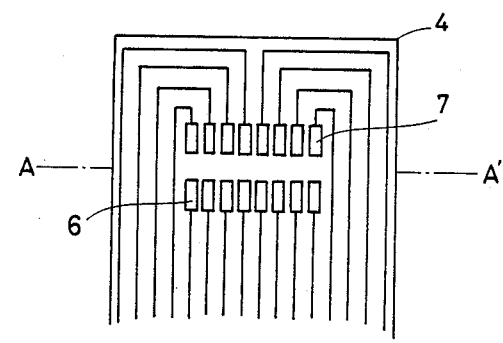
FIG. 3 is a development drawing of the flexible wiring substrate of the embodiment of the present invention shown in FIG. 1.

FIG. 3 is a development drawing of the flexible wiring substrate 4 of the embodiment of the present invention shown in FIG. 1. Electrodes 7 of the flexible wiring substrate 4 are connected to the terminals 3 of the connector 1. Accordingly, the flexible wiring substrate 4 is bent at A—A', and by being inserted into the space between the terminals of the connector 1, the two-stage terminals 2 and 3 contact the electrodes 6 and 7.

Figure 4:
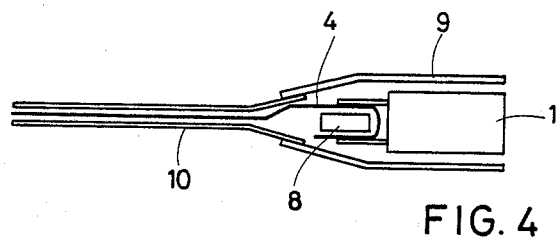
FIG. 4 is a sectional drawing of the electric connecting device provided with a cable protection cover and a connector cover for the connected flexible wiring substrate and the connector, respectively, which are connected as in FIG. 2.

FIG. 4 is a sectional drawing of the electric connecting device provided with a cable protection cover 10 and a connector cover 9 for the connected flexible wiring substrate 4, and the connector 1, which are connected as in FIG. 2. The connector cover 9 is made of a metal and a protective cover 10 is made of a conductive member. Furthermore, electric wirings, produced of a substance such as copper foil or carbon paste, are applied to one side of the flexible wiring substrate 4, and an insulating film of polyester or similar material is coated on the outside of the wiring to prevent it from being exposed. In this way, short circuits are avoided by the protective cover 10.

Next, another embodiment of the present invention will be explained.

Figure 5:
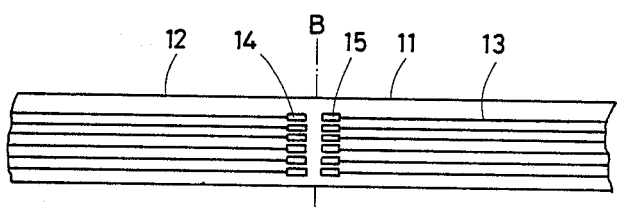
FIG. 5 (1) is a development drawing of the flexible wiring substrate used in an another embodiment of the electric connecting device according to the present invention.
Figure 5:
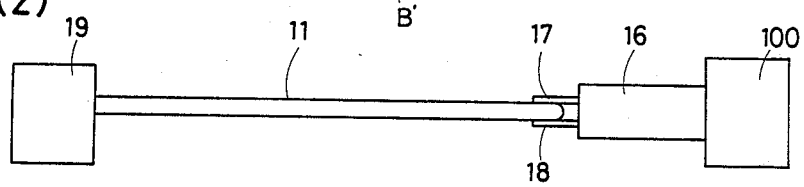

FIG. 5 (1) is a development drawing of the flexible wiring substrate used in another embodiment of the electric connecting device according to the present invention.

FIG. 5 (2) is schematic drawing showing another embodiment of the electric connecting device according to the present invention being used between equipments or substrates.

On the electric connecting device used between an apparatus (or a substrate) 19 and another apparatus (or a substrate) 100, flexible wiring substrate 11 is bent along the center section B—B', as shown in FIG. 5 (1), and inserted between terminals 17 and 18 on a connector 16. In this way, electrodes 14 and 15 are connected to the terminals 17 and 18. In the previously described embodiment, the flexible wiring substrate is bent at the end section, but in the present embodiment, it is bent at the center section, and, because of this, there are two flexible wiring substrates running inside the cable, with the result that the cable can be reduced to about half of its previous width. The bent flexible wiring substrate is inserted between two rows of the connector terminals in the abovementioned embodiment, and it is seen that by extending this line, it is quite possible to implement the use of a connector having three or four rows of terminals.

Next, a further embodiment of the electric connecting device according to the present invention using a connector having three rows of terminals will be explained.

Figure 6:
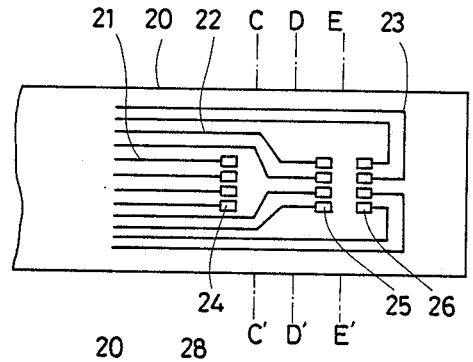
FIG. 6 (1) is a development drawing of the flexible wiring substrate being used in a further embodiment of the electric connecting device according to the present invention.
Figure 6:
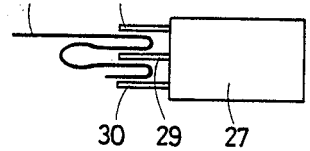

FIG. 6 (1) is a development drawing of the flexible wiring substrate being used in a further embodiment of the electric connecting device according to the present invention. A flexible wiring substrate 20 is provided on one surface with electrical wirings 21, 22, and 23, along with electrodes 24, 25, and 26, and is bent along positions C—C', D—D', and E—E'.

FIG. 6 (2) is a side view of the electric connecting device with the flexible wiring substrate of FIG. 6 (1) bent and inserted into a connector having three rows of terminals. Here, three rows of terminals 28, 29, and 30 on a connector 27 are respectively connected to electrodes 24, 25, and 26 on a flexible wiring substrate 20.

Figure 7:
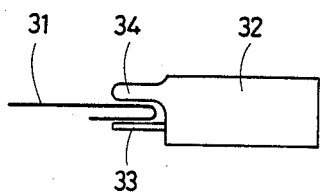
FIG. 7 is a side view showing the bent flexible wiring substrate inserted into a connector having one row of terminals, in the electric connecting device according to the present invention.

A further embodiment of the present invention has one row of connector terminals, and, as shown in FIG. 7, it is constructed to provide the terminals with a parallel supporting member, so that it is possible to use a connecting method which is the same as that of the previously discussed embodiment. In short, a connector 32 has one row of connector terminals 33, and which are provided with a corresponding support member (projecting member) 34, and the bent flexible wiring substrate 31 is inserted between the connector terminals 33 and the supporting member 34.

In the electric connecting devices which have been explained in conjunction with FIG. 1 to FIG. 7, a film may be applied in the upper position of the flexible wiring substrate corresponding to the connector cover neck position, in order to reinforce that area. This can be a film such as a polyester. By application of this film, the neck of the connector is strong, which prevents sharp bending from occurring in the flexible wiring substrate.

Because of the present invention, as outlined above, even when the pitch of the terminals is made very narrow, a stable connection can be obtained between the cable and the connector terminals, resulting in an exceedingly useful electric connecting device.

Next, a further embodiment of the cable protective cover in accordance with the present invention will be explained.

Figure 8:
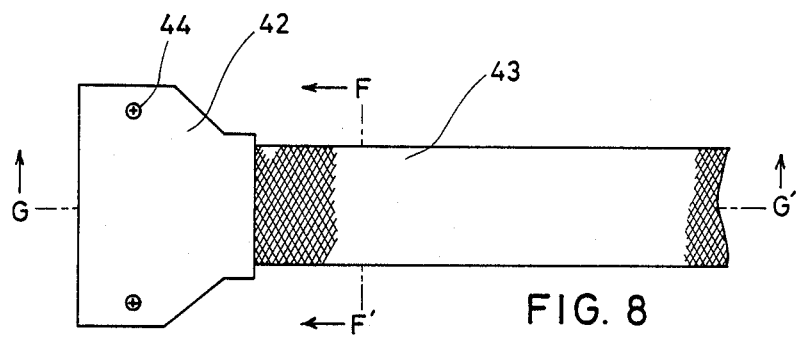
FIG. 8 is a top view of the electric connecting device equipped with a protective cover for the cable, in a further embodiment of the present invention.

FIG. 8 is a plan view of the electric connecting device equipped with a protective cover for the cable (the flexible wiring substrate), in a further embodiment of the present invention.

Figure 9:
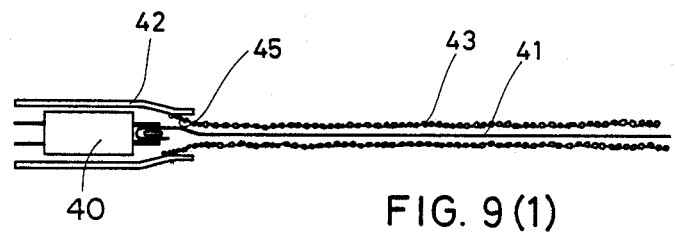
FIG. 9 (1) is a sectional drawing of a cable through section 9(1)—9(1) of FIG. 8.
Figure 9:
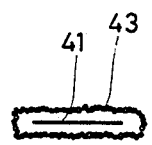

FIG. 9 (1) is a sectional drawing of a cable through section 9(1)—9(1) of FIG. 8.

FIG. 9 (2) is a sectional drawing of the electric connecting device through section 9(2)—9(2) of FIG. 8.

A protective cover 43 is woven in a net with a metal wire, having a cross section as shown in FIG. 9, and is used to enclose a flexible wiring substrate 41. The metal wire used can be made of stainless steel, brass, nickel-plated brass, or equivalent material. A connector 40 is secured to a connector cover 42 with screws 44.

Figure 10:
FIG. 10 (1) is a perspective view of the protective cable cover used on a further embodiment of the present invention.
Figure 10:
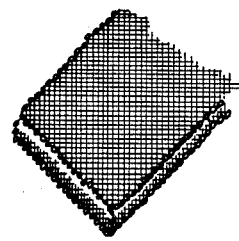

The metal wire is woven into a tubular shape as shown in FIG. 10 (1). This is further shaped in a press as shown in FIG. 10 (2). Also, in order to leave adequate space, a spacer is inserted during the pressing operation. A protective cover formed of a net material, as illustrated in FIG. 10 (2) does not expand or contract in either the longitudinal direction or across its width, and thus a cable inserted into it is mechanically protected. Furthermore, the deformation of this protective cover in the longitudinal side conforms remarkably well to any bending of the cable.

Figure 11:
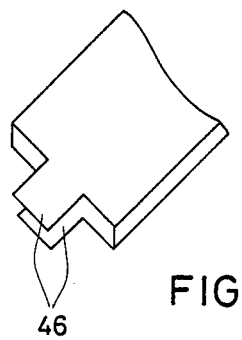
FIG. 11 is a schematic drawing of the protective cable cover having a protruding section welded to the connector cover.

The end of the protective cable cover is provided with a protruding section 46 as show in FIG. 11, and this section is spot welded to a section 45 of a connector cover 42, causing it to be joined, electrically and mechanically, to the connector cover 42. Accordingly, the cable is completely shielded from static electricity and external electrical noise. Undersirable radiation is also prevented.

Figure 12:
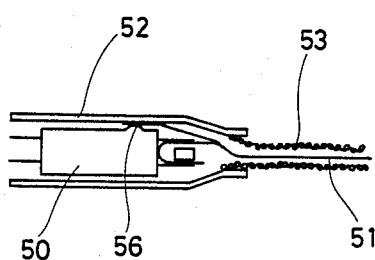
FIG. 12 is a sectional view of the electric connecting device having an internal circuit for ground to which the connector cover and the protective cover of the cable can be connected.
Figure 13:
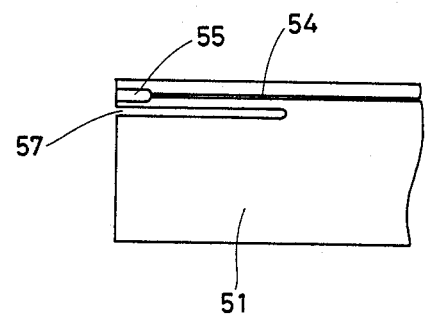
FIG. 13 is a schematic drawing of the flexible wiring substrate provided with a wiring for ground shown in FIG. 12.

FIG. 12 and FIG. 13 show the method by which the connector cover and the cable protective cover are connected to an internal circuit for ground.

Ground wiring 54 is provided for grounding purposes in a flexible wiring substrate 51 and an electrode 55 is provided, joining a connector cover 52 to the end of the ground wiring 54. There is also a cut-in section 57. As shown in FIG. 12, the electrode 55 is joined to the connector cover 52 with a projection 56 provided on a connector 50.

Also, as shown in FIG. 10 (1), in addition to the method of braiding the metal net into a tubular shape, there is also a belt-shaped braided form for bending into a ⌐⌐ shape as shown in FIG. 10 (2).

The cable according to the present invention, which has been explained in detail above, has the special features of being a flexible wiring substrate carrying conductive wirings the substrate being wrapped in a conductive wiring member in a woven form. In the present invention, along with being able to provide shielding with a small amount of material, can also provide an extremely useful cable of superior flexibility.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An electrical connecting assembly consisting of:
   a connector having two rows of parallel electrical terminals projecting from one side of said connector;
   a connector cover made of a conductive material surrounding said connector;
   a flexible wiring substrate with a plurality of electrical wiring patterns formed on only one surface of said substrate each of said electrical wiring patterns terminating at a plurality of rows of respective electrodes positioned on said one surface of said substrate, each electrode corresponding to each of said terminals of said two parallel rows of terminals, at least one row of said electrodes being completely surrounded by electrical wiring, said substrate being turned on itself so as to be inserted between said two rows of terminals of said connector such that electrical connection is made between each of said terminals and said respective corresponding electrodes, said electrical wiring patterns having a protective insulating film coating; and
   an electrically conductive cable protection cover made of a braided woven metal net of wire surrounding said flexible wiring substrate to enclose said substrate, said protection cover being secured to said connector cover, whereby said connector cover and woven metal net protection cover function, in combination, to protect said flexible wiring substrate from electrical noise, said braided woven metal net of wire providing a protective cover which will neither expand nor contract in either a longitudinal direction or across its width.

2. The electrical connecting assembly of claim 1, wherein said flexible wiring substrate further includes a means for grounding said electrical connecting assembly by way of said connector cover, said flexible wiring substrate being provided with a cut-in section separating said grounding means from said plurality of electrical wiring patterns.

3. An electrical connecting assembly as in claim 2, wherein said grounding means is joined to said connector cover by a projecting means provided on said connector.

4. An electrical connecting assembly consisting of:
   a connector having one row of a plurality of electrical terminals projecting from one side of said connector and a corresponding row of support members parallel to each of said terminals;
   a connector cover made of a conductive material surrounding said connector;
   a flexible wiring substrate with a plurality of electrical wiring patterns formed on only one surface of said substrate each of said electrical wiring patterns terminating at a plurality of rows of respective electrodes positioned on said one surface of said substrate, each electrode corresponding to each of said terminals, at least one row of said electrodes being completely surrounded by electrical wiring, said substrate being turned on itself so as to be inserted between said row of terminals and corresponding row of support members, such that electrical connection is made between each of said terminals and said corresponding electrodes, said plurality of electrical wiring patterns having an insulating film thereon; and an electrically conductive cable protection cover made of a braided woven metal net of wire surrounding said flexible wiring substrate, to enclose said substrate, said protection cover being secured to said connector cover, whereby said connector cover and woven metal net protection cover function, in combination, to protect said flexible wiring substrate from electrical noise, said braided woven metal net of wire providing a protective cover which will neither expand nor contract in either a longitudinal direction or across its width.

5. The electrical connecting assembly of claim 4, wherein said flexible wiring substrate further includes a means for grounding said electrical connecting assembly by way of said connector cover, said flexible wiring substrate being provided with a cut-in section separating said grounding means from said plurality of electrical wiring patterns.

6. An electrical connecting assembly as in claim 5, wherein said grounding means is joined to said connector cover by a projection means provided on said connector.

7. An electrical connecting assembly consisting of:
a connector having at least three rows of parallel electrical terminals projecting from one side of said connector;
a connector cover made of a conductive material surrounding said connector;
a flexible wiring substrate with a plurality of electrical wiring patterns on the surface thereof each of said electrical wiring patterns terminating at respective electrodes positioned on said substrate corresponding to each of said terminals such that when said substrate is turned on itself in a serpentine configuration so as to be inserted between said rows of terminals of said connector, electrical connection is made between each of said terminals and said electrodes, said electrical wiring patterns having a protective insulating film coating; and
an electrically conductive cable protection cover made of a braided woven metal net surrounding said flexible wiring substrate to enclose said substrate, said protection cover being secured to said connector cover, whereby said connector cover and braided woven metal net protection cover function, in combination, to protect said flexible wiring substrate from electrical noise.

8. The electrical connecting assembly of claim 7, wherein said electrical wiring patterns consist of copper film or carbon paste and said protective insulating film coating consists of a polyester.

9. The electrical connecting assembly of claim 7, wherein said flexible wiring substrate further includes a means for grounding said electrical connecting assembly by way of said connector cover, said flexible wiring substrate being provided with a cut-in section separating said grounding means from said plurality of electrical wiring patterns.

10. An electrical connecting assembly as in claim 9, wherein said grounding means is joined to said connector cover by a projecting means provided on said connector.

* * * * *